(12) United States Patent
Jung et al.

(10) Patent No.: US 8,039,972 B2
(45) Date of Patent: *Oct. 18, 2011

(54) PRINTED CIRCUIT BOARD AND METHOD THEREOF AND A SOLDER BALL LAND AND METHOD THEREOF

(75) Inventors: Ky-hyun Jung, Cheonan-si (KR); Heui-seog Kim, Cheonan-si (KR); Sang-jun Kim, Cheonan-si (KR); Wha-su Sin, Cheonan-si (KR); Ho-geon Song, Cheonan-si (KR); Jun-young Ko, Cheonan-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 104 days.

This patent is subject to a terminal disclaimer.

(21) Appl. No.: 12/458,429

(22) Filed: Jul. 13, 2009

(65) Prior Publication Data

US 2009/0278249 A1    Nov. 12, 2009

Related U.S. Application Data

(63) Continuation of application No. 11/486,064, filed on Jul. 14, 2006, now Pat. No. 7,576,438.

(30) Foreign Application Priority Data

Aug. 11, 2005    (KR) .......................... 10-2005-0073732

(51) Int. Cl.
*H01L 23/48* (2006.01)
*H01L 23/52* (2006.01)
*H01L 29/40* (2006.01)

(52) U.S. Cl. ........................................ 257/781; 257/780

(58) Field of Classification Search .................. 257/786, 257/778, 784, 780, 781

See application file for complete search history.

(56) References Cited

U.S. PATENT DOCUMENTS 3,871,014 A * 3/1975 King et al. .................... 257/779
5,598,036 A * 1/1997 Ho ................................ 257/738
(Continued)

FOREIGN PATENT DOCUMENTS

JP    2004-165376    6/2004
(Continued)

*Primary Examiner* — Sheila Clark
(74) *Attorney, Agent, or Firm* — Harness, Dickey & Pierce, P.L.C.

(57) ABSTRACT

A printed circuit board and method thereof and a solder ball land and method thereof. The example printed circuit board (PCB) may include a first solder ball land having a first surface treatment portion configured for a first type of resistance and a second solder ball land having a second surface treatment portion configured for a second type of resistance. The example solder ball land may include a first surface treatment portion configured for a first type of resistance and a second surface treatment portion configured for a second type of resistance. A first example method may include first treating a first surface of a first solder ball land to increase a first type of resistance and second treating a second surface of a second solder ball land to increase a second type of resistance other than the first type of resistance. A second example method may include first treating a solder ball land to increase a first type of resistance and second treating the solder ball land to increase a second type of resistance other than the first type of resistance.

32 Claims, 7 Drawing Sheets

U.S. PATENT DOCUMENTS

| | | |
|---|---|---|
| 5,641,946 A | 6/1997 | Shim |
| 5,864,470 A * | 1/1999 | Shim et al. ............... 361/777 |
| 6,184,062 B1 * | 2/2001 | Brofman et al. ............ 438/106 |
| 6,291,895 B1 * | 9/2001 | Taniguchi et al. ........... 257/782 |
| 6,350,669 B1 * | 2/2002 | Pu et al. .................... 438/613 |
| 6,713,871 B2 * | 3/2004 | Searls et al. ............... 257/738 |
| 6,781,245 B2 * | 8/2004 | Huang ....................... 257/780 |
| 6,879,041 B2 * | 4/2005 | Yamamoto et al. .......... 257/737 |
| 7,125,745 B2 * | 10/2006 | Chen et al. ................. 438/108 |
| 2003/0193094 A1 | 10/2003 | Takahashi et al. |
| 2004/0099716 A1 * | 5/2004 | Yuan et al. ................. 228/246 |
| 2007/0023610 A1 * | 2/2007 | Kim et al. ................ 250/206.2 |
| 2009/0302468 A1 * | 12/2009 | Baek et al. ................. 257/738 |

FOREIGN PATENT DOCUMENTS

JP     2004-165375    *   9/2004

* cited by examiner

PRINTED CIRCUIT BOARD AND METHOD THEREOF AND A SOLDER BALL LAND AND METHOD THEREOF

PRIORITY STATEMENT

This application is a continuation of U.S. patent application Ser. No. 11/486,064 filed on Jul. 14, 2006 now U.S. Pat. No. 7,576,438 which claims the benefit of priority under 35 USC §119 to Korean Patent Application No. 10-2005-0073732, filed on Aug. 11, 2005, in the Korean Intellectual Property Office, the contents of each application are incorporated herein by reference in their entirety.

BACKGROUND OF THE INVENTION

1. Field of the Invention

Example embodiments of the present invention relate generally to a printed circuit board and method thereof and a solder ball land and method thereof, and more particularly to higher resistant printed circuit board and method thereof and a higher resistant solder ball land and method thereof.

2. Description of the Related Art

A printed circuit board (PCB) used as a base frame in a semiconductor package manufacturing process may have adjacent nickel and gold layer surface treatment portions on a solder ball land prepared at the bottom of the PCB. The gold layer may facilitate a fusion of a solder ball, and the nickel layer may have a higher heat conductivity which may allow for greater heat dissipation of heat generated in a semiconductor chip to areas away from the semiconductor chip.

Older conventional solder balls may include a tin and lead compound. Later conventional solder balls, after lead became a disfavored material, may be made to be lead-free. The lead-free solder balls may be used in manufacturing processes of mobile phones and/or other semiconductor package devices so as to increase a durability of the manufactured device (e.g., against possible impacts due to dropping and bending).

Conventional surface treatment process may include organic solderability preservatives (OSP). In an example, an OSP may be used in a surface treatment process for forming a tin-based, lead-free solder ball, a copper solder ball land, and/or an inter-metallic contact (IMC) layer. The OSP may include a higher-adhesive organic glue on the surface of copper that may be used to surface treat a solder ball land surface to reduce or prevent oxidation thereof.

FIG. 1 is a sectional view of a conventional ball grid array (BDA) semiconductor package 50. Referring to FIG. 1, the BGA semiconductor package 50 may include a PCB 20 with connection terminals 16 on a first surface and a solder ball land 12 on a second surface, a semiconductor chip 18 connected to the connection terminals 16 through a gold wire, and a lead-free solder ball 26 connected to the solder ball land 12. Additionally, the ball grid array (BGA) package 50 may include a sealing resin 24 sealing the semiconductor chip 18 and the gold wire 22. The solder ball land 12 may be surface treated with a uniform treating process. A reference numeral 10 may denote an insulating substrate used as a main body of the PCB 20, and a reference numeral 14 may denote a solder resist.

FIG. 2 is a sectional view illustrating the conventional solder ball land 12 of FIG. 1.

FIG. 3 is a sectional view illustrating a process of attaching the lead-free solder ball 26 to the solder ball land 12 of FIG. 2.

Referring to FIGS. 2 and 3, the solder ball land 12 (e.g., portion A of FIG. 1) may include a base copper layer 2, a nickel layer 4 and a gold layer 6. The conventional attachment process of FIG. 3 may include applying solder 9 to the solder ball land 12 formed of the copper layer 2 treated with the nickel layer 4 and the gold layer 6, mounting the solder ball 26 thereon, and attaching the solder ball 26 to the solder ball land 12 through an IR reflow process. Because the gold layer 6 may be thinner than the copper layer 2 and/or the nickel layer 4, the gold layer 6 may dissipate (e.g., may be reduced and/or removed) during the attachment of the solder ball 26 to the solder ball land 12.

Accordingly, an adhering surface (e.g., an adhesive layer such as glue) between the solder ball 26 and the solder ball land 12 may include a metal bonding layer 11 containing a nickel and tin alloy (e.g., after the gold layer 6 may be reduced/removed). The metal bonding layer 11 may have a higher heat conductivity, but also may be associated with lower stress (e.g., shock and/or bending) resistance.

FIG. 4 is a sectional view illustrating another conventional embodiment of the solder ball land 12 of FIG. 1.

FIG. 5 is a sectional view illustrating a process of attaching the lead-free solder ball 26 to the solder ball land 12 of FIG. 4.

Referring to FIGS. 4 and 5, the solder ball land 12 (e.g., portion A of FIG. 1) may include the copper layer 2 as in FIG. 2 with an OSP 28 being applied in place of the gold layer 6 and the nickel layer 4. The conventional attachment process of FIG. 5 may include applying the OSP 28 on the copper layer 2 of the solder ball land 12. A flux 8 may be applied to reduce/remove the OSP 28. The lead-free solder ball 26 may then be attached on the copper layer 2. A metal bonding layer 13 including a copper-tin alloy may be formed in a bonding surface between the solder ball 26 and the solder ball land 12.

The metal bonding layer 13 containing the copper-tin alloy may have a higher durability (e.g., to bending and/or impacts) than the metal bonding layer 11 of FIG. 2, but may also be associated with a lower heat conductivity than the metal bonding layer 11.

Also, because the surface treatment process of FIG. 5 using the OSP 28 may necessitate the additional step of reducing/removing the OSP 28 through the separate flux process (e.g., applying the flux 8 to reduce/remove the OSP 28) during the attachment of the solder ball 26, the fabrication process may increase in complexity, which may likewise increase defects occurring during the surface treatment process of FIG. 5. Such defects may include, for example, a "non-wet" defect. The non-wet defect may be caused, at least in part, because the metal bonding layer 13 may not be formed sufficiently. The metal bonding layer 13 may not be formed sufficiently because the surface of the solder ball land 12 may be deformed by the degradation of the OSP 28 during the application of the flux 8. The non-wet defect may be difficult to detect by visual and/or other non-invasive inspections (e.g., inspections not structurally damaging the solder ball 26), thereby increasing the difficulty of managing the integrity of the surface treatment process of FIG. 5. Accordingly, the reliability of the semiconductor package 50 in FIG. 1 may be reduced.

FIG. 6 is a sectional view illustrating a bonding surface between the solder ball 26 and the solder ball land 12 of FIG. 5. Referring to FIG. 6, the metal bonding layer 13, which may include a copper-tin alloy through the OSP surface treatment, may induce the generation of voids 32 in the copper layer 2 adjacent to the metal bonding layer 13 over a period of time. The metal bonding layer 13 may thereby not be suitable for use in semiconductor packages requiring longer lifespans.

The voids 32 may be generated because copper in the copper layer 2 may diffuse into the metal bonding layer 13 (e.g., formed of Cu6Sn5) over the period of time, for example, after the semiconductor package is mounted on a motherboard. The voids 32 may cause degradation to the solder joint reliability (SJR) of the copper layer 2.

Accordingly, the above-described conventional semiconductor packages may not be capable of simultaneously having both a higher resistance to stress (e.g., bending, physical impacts or shocks, etc.) and a higher heat resistance.

SUMMARY OF THE INVENTION

An example embodiment of the present invention is directed to a printed circuit board (PCB), including a first solder ball land having a first surface treatment portion configured for a first type of resistance and a second solder ball land having a second surface treatment portion configured for a second type of resistance.

Another example embodiment of the present invention is directed to a solder ball land, including a first surface treatment portion configured for a first type of resistance and a second surface treatment portion configured for a second type of resistance.

Another example embodiment of the present invention is directed to a method of forming a resistant printed circuit board (PCB), including first treating a first surface of a first solder ball land to increase a first type of resistance and second treating a second surface of a second solder ball land to increase a second type of resistance other than the first type of resistance.

Another example embodiment of the present invention is directed to a method of forming a resistant solder ball land, including first treating a solder ball land to increase a first type of resistance and second treating the solder ball land to increase a second type of resistance other than the first type of resistance.

Another example embodiment of the present invention is directed to a PCB having two or more types of surface treatment portions on a solder ball land.

Another example embodiment of the present invention is directed to a semiconductor package having a plurality of metal bonding layers on a solder ball land.

BRIEF DESCRIPTION OF THE DRAWINGS

The accompanying drawings are included to provide a further understanding of example embodiments of the invention, and are incorporated in and constitute a part of this specification. The drawings illustrate example embodiments of the present invention and, together with the description, serve to explain principles of the present invention.

DETAILED DESCRIPTION OF EXAMPLE EMBODIMENTS OF THE PRESENT INVENTION

Figure 1:
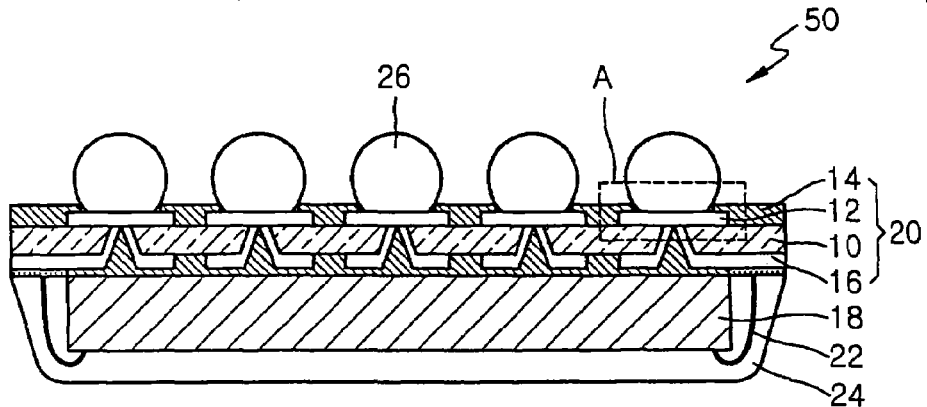
FIG. 1 is a sectional view of a conventional ball grid array (BDA) semiconductor package.
Figure 2:
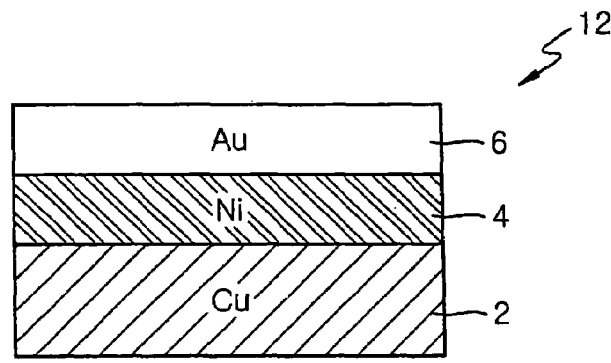
FIG. 2 is a sectional view illustrating a conventional solder ball land.
Figure 3:
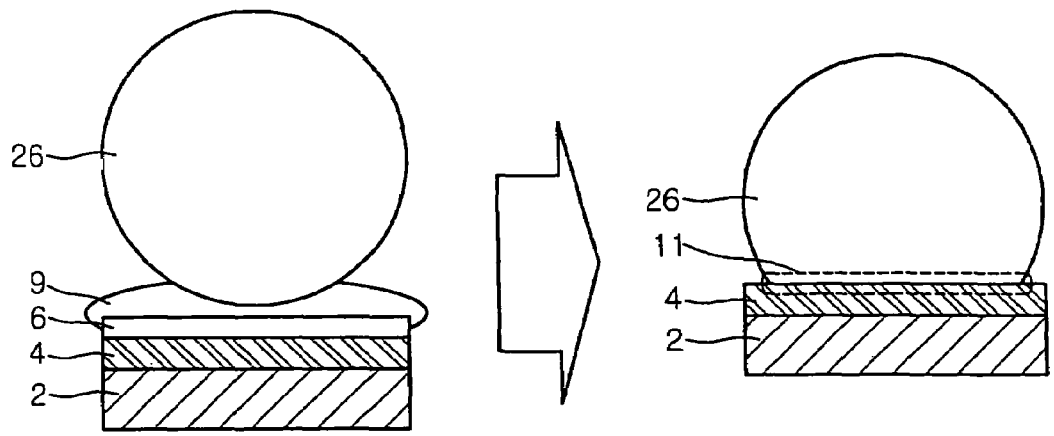
FIG. 3 is a sectional view illustrating a process of attaching a lead-free solder ball to the solder ball land of FIG. 2.
Figure 4:
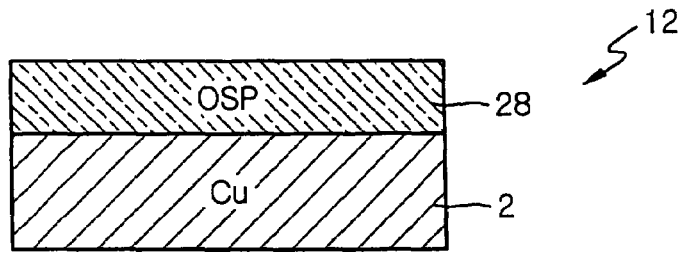
FIG. 4 is a sectional view illustrating another conventional solder ball land.
Figure 5:
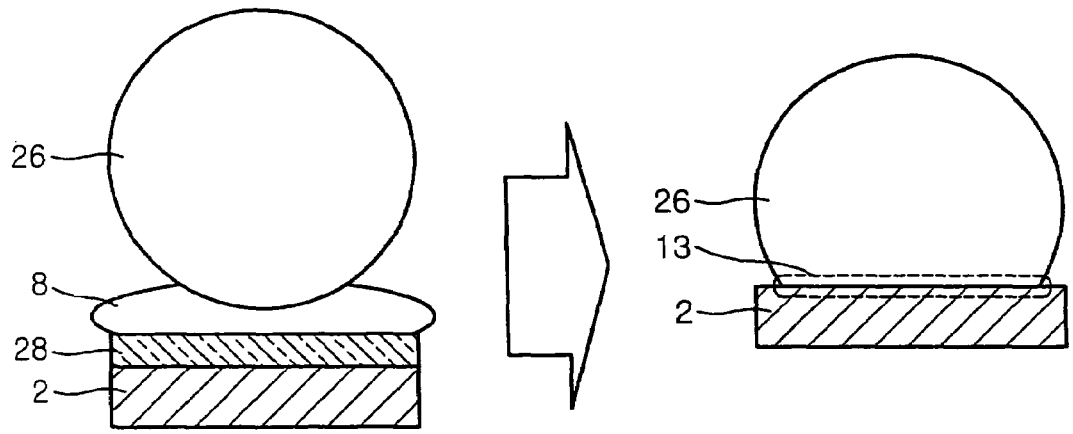
FIG. 5 is a sectional view illustrating a process of attaching a lead-free solder ball to the solder ball land of FIG. 4.
Figure 6:
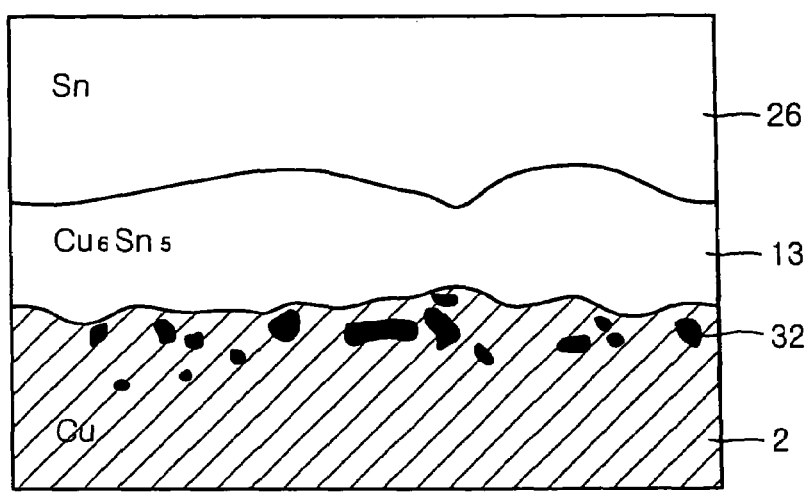
FIG. 6 is a sectional view illustrating a bonding surface between the solder ball and the solder ball land of FIG. 5.

Example embodiments of the present invention are described more fully hereinafter with reference to the accompanying drawings, in which example embodiments of the present invention are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 7A:
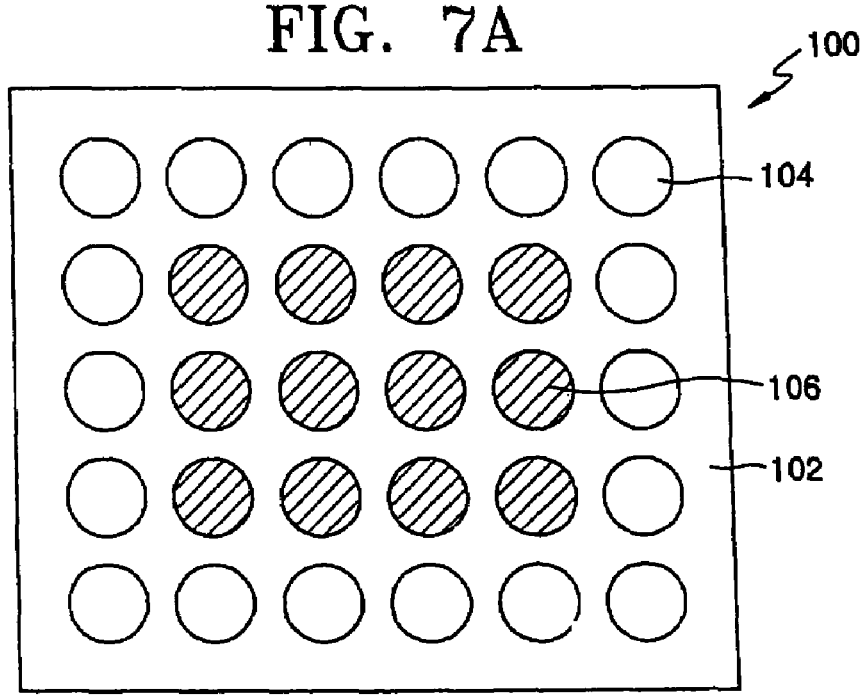
FIG. 7A is a plan view illustrating a lower surface of a printed circuit board (PCB) according to an example embodiment of the present invention.
Figure 7B:
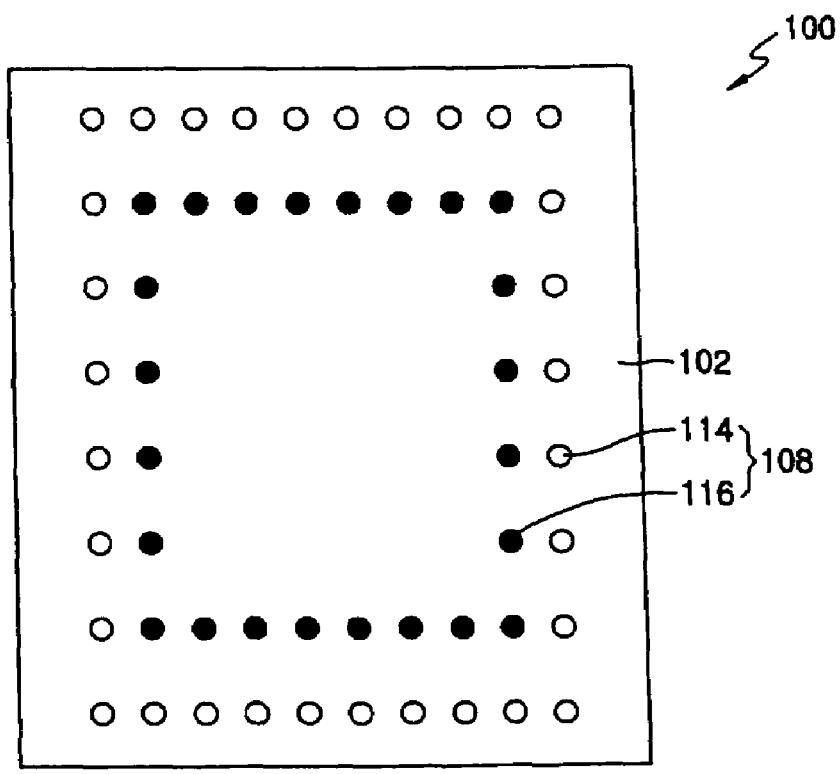
FIG. 7B is a plan view illustrating an upper surface of the PCB of FIG. 7A.

FIG. 7A is a plan view illustrating a lower surface of a printed circuit board (PCB) 100 according to an example embodiment of the present invention. FIG. 7B is a plan view illustrating an upper surface of the PCB 100 of FIG. 7A.

In the example embodiment of FIGS. 7A and 7B, the PCB 100 may include a substrate 102. The substrate 102 may include an insulating material such as FR4 and/or BT resin. While not shown in FIGS. 7A and 7B, connection terminals 114 and 116 may connect to a semiconductor chip (not shown) disposed on a first surface (e.g., an upper surface) of the substrate 102. A first solder ball land 104 (e.g., after undergoing a first surface treatment) may be disposed on an edge region of a second surface (e.g., a lower surface) of the substrate 102. A second solder ball land 106 (e.g., after undergoing a second surface treatment) may be disposed on a center region of the second surface.

In the example embodiments of FIGS. 7A and 7B, the first surface treatment may be an OSP surface treatment, and the second surface treatment may include sequentially stacking nickel layers and gold layers. Accordingly, because the first solder ball land 104 disposed on the edge region of the substrate 102, which may be subject to physical impacts, shocks and/or bending, may be OSP treated, a first metal bonding layer including a tin-copper alloy may be formed after the attachment of the solder ball to the first solder ball land 104 to provide the first solder ball land 104 with higher resistance to stresses such as physical impacts and/or bending. Because the second solder ball land 106 disposed on the center region of the substrate 102 (e.g., which may receive a higher amount of heat radiated from the semiconductor chip) may be surface treated with both the nickel and gold layers, a second metal bonding layer made of a nickel-tin alloy may be formed so as to increase heat dissipation for heat radiated from the semiconductor chip.

In the example embodiment of FIGS. 7A and 7B, the above-described "multi" surface treating method employing two or more types of surface treatments to different solder ball lands may also be applied to the connection terminals 114 and 116 on the first surface. In this example, the connection terminals 114 and 116 may be connected to a solder bump (not shown) on the semiconductor chip. The connection terminal 114 may be OSP surface treated and formed on the edge region, and the connection terminal 116 may be surface treated with nickel and gold layers and formed on the center region. The "edge" and "center" regions illustrated in FIGS. 7A/7B are given for purposes of example only, and other example embodiments may include alternative variations, such as different shapes, connection terminal numbers, etc.

Figure 8:
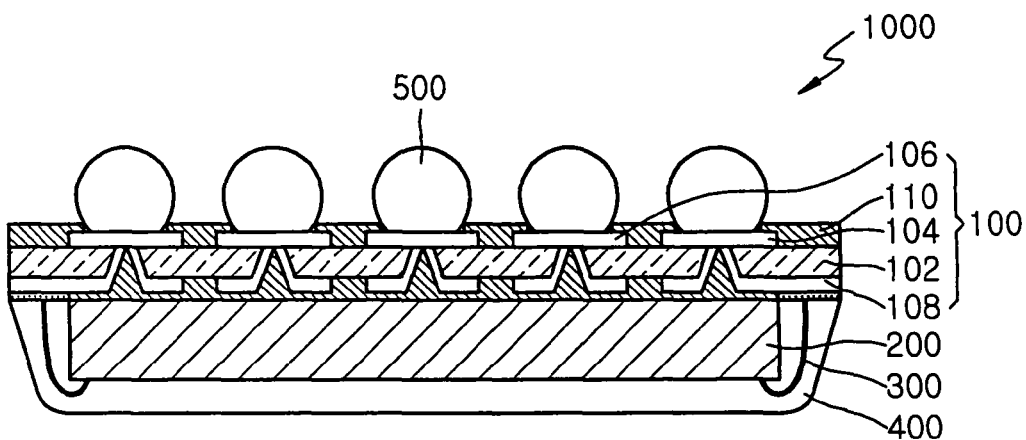
FIG. 8 is a sectional view of a semiconductor package according to another example embodiment of the present invention.
Figure 9:
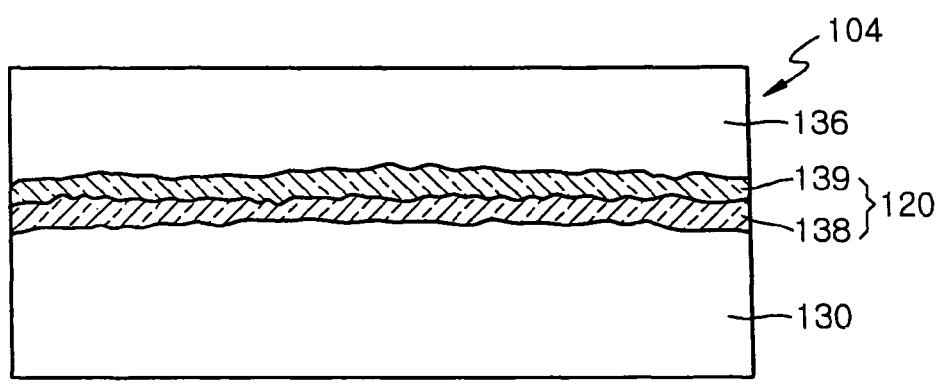
FIG. 9 is a sectional view illustrating a first metal bonding layer formed on a first solder ball land at an edge region of a substrate of the semiconductor package of FIG. 8.
Figure 10:
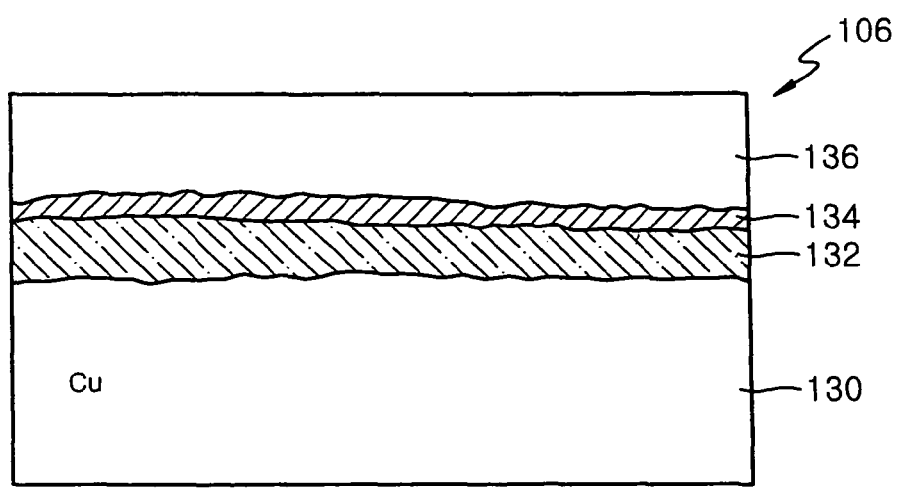
FIG. 10 is a sectional view illustrating a second metal bonding layer formed on a second solder ball land at a center region of the substrate of the semiconductor package of FIG. 8.

FIG. 8 is a sectional view of a semiconductor package 1000 according to another example embodiment of the present invention. FIG. 9 is a sectional view illustrating a first metal bonding layer formed on a first solder ball land at an edge region of a substrate of the semiconductor package 1000 of FIG. 8. FIG. 10 is a sectional view illustrating a second metal bonding layer formed on a second solder ball land at a center region of the substrate of the semiconductor package 1000 of FIG. 8.

In the example embodiments of FIG. 8, the semiconductor package 1000 may include the PCB 100 of FIGS. 7A/7B as a base frame. A semiconductor chip 200 may be connected to the first surface of the PCB 100 by the connection terminals 108, and solder balls 500 may be attached to the first and second solder ball lands 104 and 106 on the second surface of the PCB 100. In an example, the solder ball 500 may include lead-free solder. A reference numeral 110 may denote a solder resist.

In the example embodiments of FIGS. 8 and 9, the PCB 100 may further include a first metal bonding layer 120 formed on a bonding surface between the solder ball 500 and the first solder ball land 104 disposed at the edge region of the second surface of the PCB 100.

In the example embodiments of FIGS. 8 and 10, a second metal bonding layer 134 may be formed on a bonding surface between the solder ball 500 and the second solder ball land 106 disposed at the center region of the second surface of the PCB 100.

In the example embodiment of FIGS. 8 and 9, the first metal bonding layer 120 may include a first alloy layer 138 (e.g., a copper-tin alloy layer with a composition including Cu3Sn) formed near a copper layer 130 and a second alloy layer 139 (e.g., a copper-tin alloy layer with a composition including Cu5Sn5) formed near a tin layer 136. In an example, the second metal bonding layer 134 may include a nickel-tin alloy.

In the example embodiments of FIGS. 8 to 10, the first metal bonding layer 120 may be formed by performing an OSP treatment on a surface of the first solder ball land 104, and the second metal bonding layer 134 may be formed by performing a surface treatment on a nickel layer 132 and a gold layer which may be stacked on the second solder ball land 106.

In the example embodiments of FIGS. 8 to 10, the above-described gold layer is not illustrated because the gold layer may be disproportionately thin with respect to other illustrated elements. For example, the gold layer may have a thickness of less than 1 μm and may further dissipate into the solder ball 500 during the attachment of the solder ball 500 to the second solder ball land 106. Thus, illustrating the gold layer may over-emphasize its respective size.

An example experiment will now be described with respect to FIGS. 9 and 10. In the example experiment, the first and the second metal bonding layers 120 and 134 that may be formed respectively on a bonding surface between the solder ball 500 and the first solder ball land 104 and a bonding surface between the solder ball 500 and the second solder ball land 106 may be stored for 1,000 hours at a temperature of 150° C. After the 1,000 hour storage at the 150° C. temperature, the first metal bonding layer 120 may be formed to a thickness of about 13 μm, and the second metal bonding layer 134 may be formed to a thickness of about 5 μm. Thus, the first and second bonding layers 120 and 134 may differ in both thickness and composition. It is understood that the above experiment is given for example purposes only, and metal bonding layers according to other example embodiments of the present invention may be formed under different environmental conditions (e.g., different exposure times, different exposure temperatures, etc.).

In the example embodiments of FIGS. 8 to 10, the edge region of the PCB 100 may grant the semiconductor package 1000 a higher resistance to external stresses (e.g., physical impacts, bending, shocks, etc.) due to the first metal bonding layer 120. Further, the center region of the PCB 100 may serve to better dissipate heat generated by the semiconductor chip 200 due to the second metal bonding layer 124.

In the example embodiment of FIG. 8, the semiconductor chip 200 may be bonded through a gold wire 300 to the connection terminals 108 of the PCB 100. In an alternative example, the semiconductor chip 200 may be flip-chip bonded to the connection terminals 108 through the solder bump (not shown) formed thereon. The semiconductor package 1000 may further include an underfill (not shown) formed of epoxy material to at least partially fill the space between the semiconductor chip 200 and the first surface of the PCB 100, and a sealing resin 400 for sealing the upper portion of the PCB 100, the semiconductor chip 200, and the gold wire 300.

In the example embodiment of FIG. 8, in an example, the connection terminals 108 may be surface treated with nickel and gold layers. However, if the semiconductor chip 200 is connected to the connection terminals 108 via the solder bump (e.g., flip chip bonded) instead of the gold wire 300, the above-described method of forming the first and second metal bonding layers 120 and 134 on the first and second solder ball lands 104 and 106 may be expanded so as to also be applied to form the first and second metal bonding layers 120 and 134 on the connection terminals 114 and 116, as illustrated in FIG. 7B. Accordingly, a first metal bonding layer made of a copper-tin alloy may be formed on the connection terminals 114 at the edge region, and a second metal bonding layer may be formed on the connection terminals 116 at the center region inside the edge region. Thus, the semiconductor chip 200 mounted on the first surface of a PCB 100 may have a higher resistance to external stresses (e.g., physical impacts, shocks, bending, etc.) at the edge region, and the center region may have higher heat dissipating characteristics.

Figure 11A:
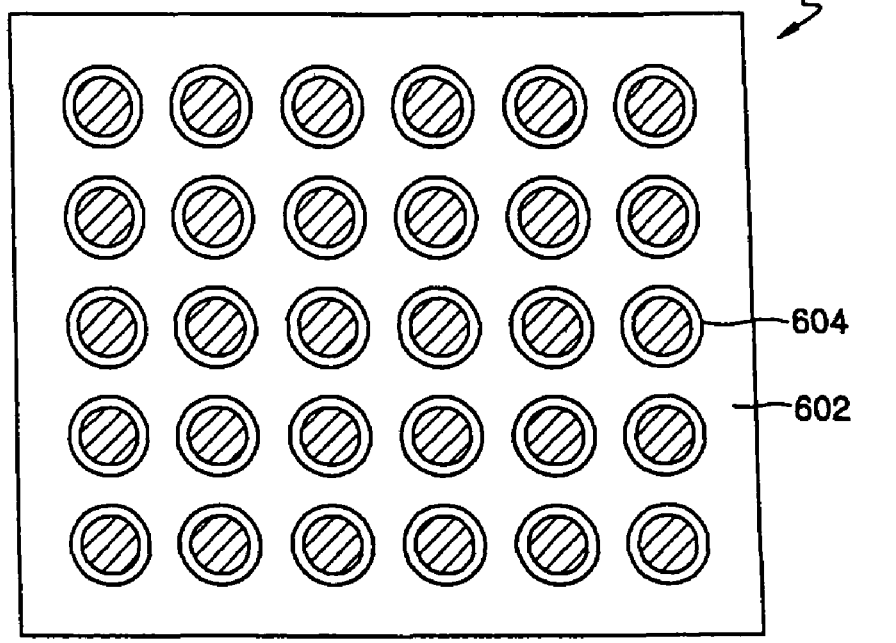
FIG. 11A is a plan view illustrating a lower surface of a PCB according to another example embodiment of the present invention.
Figure 11B:
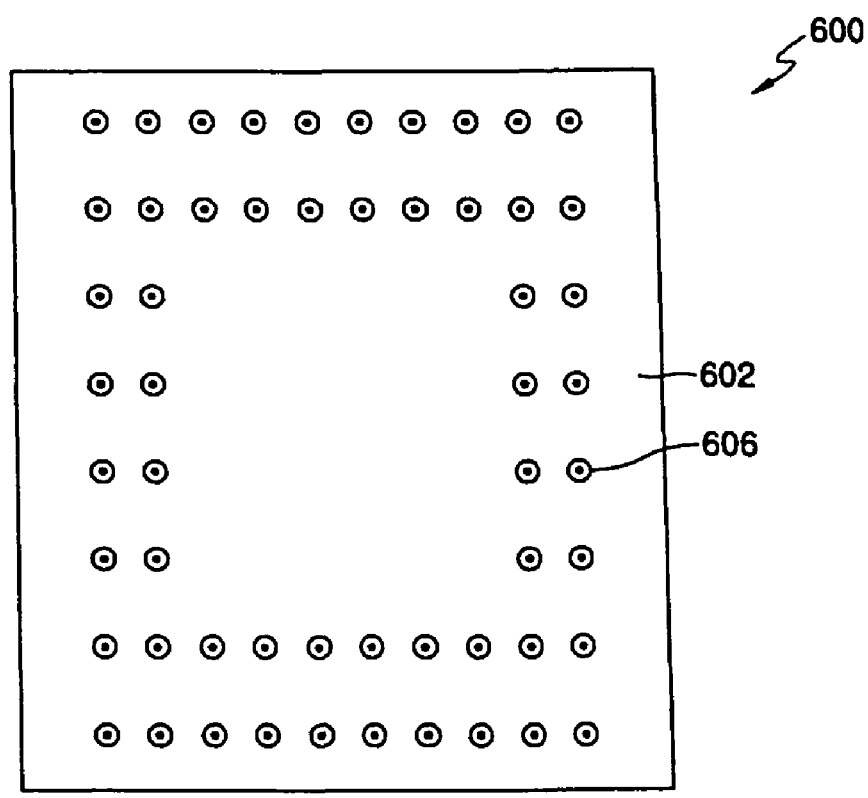
FIG. 11B is a plan view illustrating an upper surface of the PCB of FIG. 11A

FIG. 11A is a plan view illustrating a lower surface of a PCB 600 according to another example embodiment of the present invention. FIG. 11B is a plan view illustrating an upper surface of the PCB 600 of FIG. 11A. In the example embodiment of FIGS. 11A and 11B, unlike the example embodiment of FIGS. 7A and 7B in which the edge and center surface regions of the insulating substrate 102 are surface treated with different treatment processes, the edge and center surface regions of an insulating substrate 602 of the PCB 600 may be treated in a similar fashion.

In the example embodiment of FIGS. 11A and 11B, the PCB 600 may include the insulating substrate 602, connection terminals 606 disposed on an upper surface of the insulating substrate 602 which may be connected to a semiconductor chip, and a compound solder ball land 604 disposed on a lower surface of the substrate 602. The compound solder ball land 604 may include a first surface treatment portion on an edge region and a second surface treatment portion on a center region. In an example, an entirety of the surface of the connection terminals 606 may be surface treated with sequentially-stacked nickel and gold layers. Alternatively, a compound surface treatment may be selectively performed on the surface of the connection terminals 606, as will now be described with respect to the example embodiment of FIG. 12.

Figure 12:
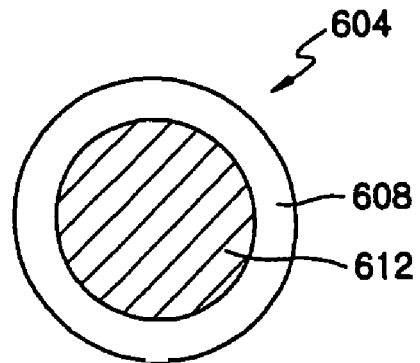
FIG. 12 is an enlarged plan view of a compound solder ball land according to another example embodiment of the present invention.

FIG. 12 is an enlarged plan view of the compound solder ball land 604 illustrated in FIG. 11A.

In the example embodiment of FIG. 12, an OSP surface treatment 608 (e.g., a first performed surface treatment) may be performed on an edge region of the compound solder ball land 604, and a second surface treatment 612 of sequentially-stacked nickel and gold layers may be performed on a center region of the compound solder ball land 604. Accordingly, when bonded to a solder ball, the edge region of each compound solder ball land 604 may have a higher resistance to external stresses (e.g., physical impacts, shocks, bending, etc.) and the center region may have higher heat dissipation characteristics. The particular shape and configuration of the first and second surface treatment portions 608 and 612 are given for example purposes only, and it will be readily appreciated that other example embodiments of the present invention may have surface treatment portions with other shapes, dimensions, etc.

Figure 13:
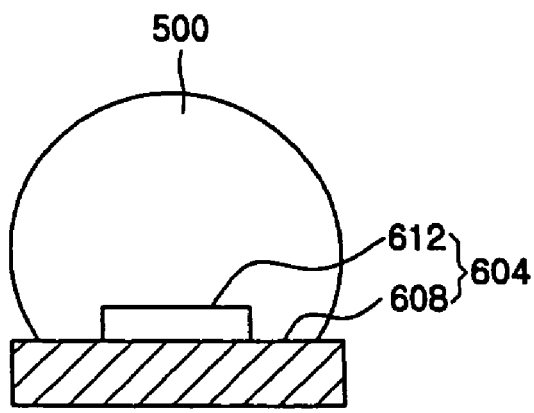
FIG. 13 is a sectional view illustrating a convex surface treatment portion of the compound solder ball land of FIG. 12 according to another example embodiment of the present invention.

FIG. 13 is a sectional view illustrating a convex (e.g., protruding) surface treatment portion of the compound solder ball land 604 of FIG. 12 according to another example embodiment of the present invention. In the example embodiment of FIG. 13, nickel and gold layers 612 may be sequentially stacked on a surface of the compound solder ball land 604 (e.g., formed of copper). Accordingly, as shown in FIG. 13, an uneven, protruding or non-flush structure may be formed, which may improve solder joint reliability (SJR) if the solder ball 500 is attached to the compound solder ball land 604.

Figure 14:
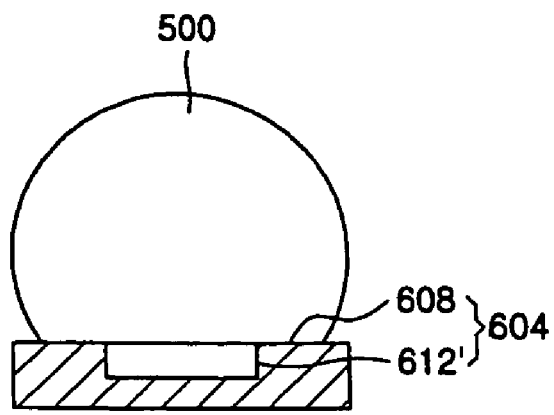
FIG. 14 is a sectional view illustrating a concave surface treatment portion of the compound solder ball land of FIG. 12 according to another example embodiment of the present invention.

FIG. 14 is a sectional view illustrating a concave (e.g., flush) surface treatment portion of the compound solder ball land 604 of FIG. 12 according to another example embodiment of the present invention. In the example embodiment of FIG. 14, the compound solder ball land 604 may be concaved (e.g., partially hollowed out) and nickel and gold layers 612' may be formed to fill the concaved portion of the compound colder ball land 604 so as to form a resultant flush surface.

Figure 15:
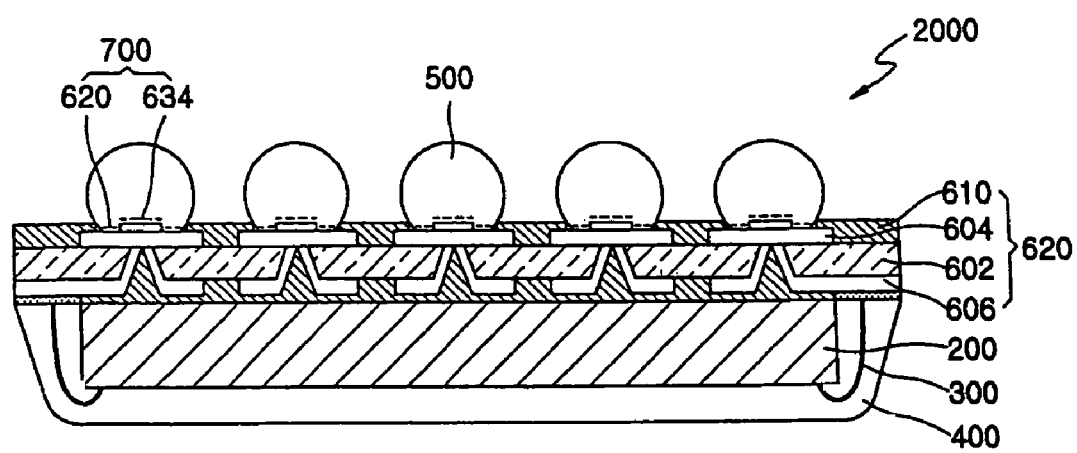
FIG. 15 is a sectional view of a semiconductor package according to another example embodiment of the present invention.

FIG. 15 is a sectional view of a semiconductor package 2000 according to another example embodiment of the present invention.

In the example embodiment of FIG. 15, the semiconductor package 2000 may include the PCB 600 described above with respect to FIGS. 11A/11B as a base frame. A semiconductor chip 200 may be connected to a first surface of an insulating substrate 602 on the PCB 600 by connection terminals 606, and lead-free solder balls 500 may be attached to the compound solder ball lands 604 disposed on a second surface of the insulating substrate 602.

In the example embodiment of FIG. 15, the PCB 600 may further include a compound metal bonding layer 700 having a first metal bonding layer 620 formed on an edge region of a bonding surface between the compound solder ball land 604 and the solder ball 500 and a second metal bonding layer 634 formed on a center region thereof. The first metal bonding layer 620 may be OSP surface treated with a copper-tin alloy, and the second metal bonding layer 634 may be surface treated with sequentially-stacked nickel and gold layers. A reference numeral 610 may denote a solder resist.

In the example embodiment of FIG. 15, the semiconductor package 2000 may further include an underfill (not shown) at least partially filling the space between the semiconductor chip 200 and the first surface of the PCB. The semiconductor package 2000 may further include a sealing resin 400 for sealing the semiconductor chip 200 and the gold wire 300. In an example, the semiconductor chip 200 may be mounted on the PCB 600 through the gold wire 300. In an alternative example, the semiconductor chip 200 may be connected using a solder bump formed on the semiconductor chip 200. In an example, the underfill may be applied during mounting of the semiconductor chip 200 on the PCB 600 through the solder bump.

In another example embodiment of the present invention, a solder ball land may include a first metal bonding layer formed of a heat dissipating material (e.g., a conductive material such as a copper and tin compound). The solder ball land may further include a second metal bonding layer formed of a stress resistant material (e.g., a physically strong material such as a nickel and tin compound). It will be appreciated that the inclusion of both the heat dissipating material and the stress resistant material may protect a semiconductor device including the solder ball land against both physical impacts as well as excessive heat.

Example embodiments of the present invention being thus described, it will be obvious that the same may be varied in many ways. For example, while specific elements and compounds are described above (e.g., copper and tin, nickel and tin, etc.), it is understood that such compounds are given for example purposes only. For example, a compound including copper and tin may have higher conductivity characteristics which likewise allows for higher heat dissipation. It will be appreciated, however, that other example materials with heat dissipation characteristics may be used in place of the copper and tin compound. Likewise, a compound including nickel and tin may be strong and resistant to physical stresses and/or impacts such as twisting and bending of a semiconductor package. It will be appreciated, however, that other example materials with stress resistant characteristics may be used in place of the copper and tin compound.

Such variations are not to be regarded as a departure from the spirit and scope of example embodiments of the present invention, and all such modifications as would be obvious to one skilled in the art are intended to be included within the scope of the following claims.

What is claimed is:

1. A printed circuit board (PCB), comprising:
  a first metal land having a first surface treatment portion configured for a first type of resistance; and
  a second metal land having a second surface treatment portion configured for a second type of resistance, wherein a surface material of the first metal land is different from that of the second metal land, and the first type of resistance is higher heat conductivity which allows for greater heat dissipation and the second type of resistance is higher stress resistance.

2. The PCB of claim 1, further comprising:
  a substrate formed of an insulating material; wherein
  connection terminals connected to a semiconductor chip are installed on an upper surface of the substrate, and
  the first metal land is disposed on an edge region of the substrate and the second metal land is disposed on a center region of the substrate.

3. The PCB of claim 1, wherein the first surface treatment portion is applied with an organic solderability preservatives (OSP) process.

4. The PCB of claim 1, wherein the second surface treatment portion is applied by sequentially stacking a nickel layer and a gold layer on the second metal land.

5. The PCB of claim 2, wherein the connection terminals includes first connect terminals positioned in the edge region and second connection terminals positioned in the center region.

6. The PCB of claim 1, wherein each of the first and second metal lands include the first and second surface treatment portions with the first and second types of resistance, respectively.

7. The PCB of claim 1, wherein the first metal land does not include the second surface treatment portion and the second metal land does not include the first surface treatment portion.

8. A semiconductor package, comprising:
  the PCB of claim 1;
  a semiconductor chip mounted on a first surface of the PCB through connection terminals;
  first and second solder balls attached to a second surface of the PCB;
  a first metal bonding layer formed on a first bonding surface between a first solder ball and a first metal land disposed on an edge region of the second surface of the PCB; and
  a second metal bonding layer formed on a second bonding surface between a second solder ball and a second metal land disposed on a center region of the second surface of the PCB.

9. The semiconductor package of claim 8, wherein the first metal land is OSP surface treated before being attached the first solder ball.

10. The semiconductor package of claim 8, wherein the first metal bonding layer includes a copper-tin alloy.

11. The semiconductor package of claim 8, wherein the second metal land is surface treated with nickel and gold layers before being attached to the second solder ball.

12. The semiconductor package of claim 8, wherein the second metal bonding layer includes a nickel-tin alloy.

13. The semiconductor package of claim 8, wherein the semiconductor chip is mounted on the connection terminals through one of a gold wire and a solder bump.

14. The semiconductor package of claim 8, further comprising:

a sealing resin covering the semiconductor chip and the first surface of the PCB.

15. The semiconductor package of claim 8, further comprising:
an underfill at least partially filling a space between the semiconductor chip and the first surface of the PCB.

16. The semiconductor package of claim 10, wherein at least one of the first and second solder balls is a lead-free solder ball.

17. A metal land, comprising:
a first surface treatment portion configured for a first type of resistance and a second surface treatment portion configured for a second type of resistance, wherein the second surface treatment portion is applied by sequentially stacking a nickel layer and a gold layer.

18. The metal land of claim 17, wherein the first type of resistance is higher heat conductivity which allows for greater heat dissipation and the second type of resistance is higher stress resistance.

19. The metal land of claim 17, wherein the first surface treatment portion is applied with an organic solderability preservatives (OSP) process.

20. The metal land of claim 17, wherein the second surface treatment portion protrudes above a surface of the metal land.

21. The metal land of claim 17, wherein the second surface treatment portion is flush with the metal land so as not to protrude from a surface of the metal land.

22. A printed circuit board (PCB), comprising:
a substrate formed of an insulating material;
connection terminals connected to a semiconductor chip installed on an upper surface of the substrate; and
the metal land of claim 17.

23. The PCB of claim 22, wherein the connection terminals include first connection terminals in an edge region of the substrate and second connection terminals positioned in a center region of the substrate.

24. A semiconductor package, comprising:
the PCB of claim 22;
a semiconductor chip mounted on a first surface of the PCB through the connection terminals;
a solder ball attached to a second surface of the PCB; and
first and second metal bonding layers formed on a bonding surface between the solder ball and the metal land.

25. The semiconductor package of claim 24, wherein the first surface treatment portion of the metal land is flush with a surface of the metal land and the second surface treatment portion of the metal land protrudes from the surface of the metal land.

26. The semiconductor package of claim 24, wherein the semiconductor chip is mounted on the PCB through one of a gold wire and a solder bump.

27. The semiconductor package of claim 24, further comprising:
an underfill at least partially filling a space between the first surface of the PCB and the semiconductor chip.

28. The semiconductor package of claim 24, wherein the connection terminals include a compound metal bonding layer with the first metal bonding layer formed on an edge region thereof and the second metal bonding layer formed on a center region thereof.

29. The semiconductor package of claim 24, further comprising:
a sealing resin covering the semiconductor chip and the first surface of the PCB.

30. The semiconductor package of claim 24, wherein the first metal bonding layer includes a copper-tin alloy.

31. The semiconductor package of claim 24, wherein the second metal bonding layer includes a nickel-tin alloy.

32. The semiconductor package of claim 24, wherein the solder ball is a lead-free solder ball.

\* \* \* \* \*